US012353122B2

(12) United States Patent
Lin

(10) Patent No.: US 12,353,122 B2
(45) Date of Patent: Jul. 8, 2025

(54) METHOD FOR FORMING PHOTOMASK

(71) Applicant: Powerchip Semiconductor Manufacturing Corporation, Hsinchu (TW)

(72) Inventor: Chun-Liang Lin, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 511 days.

(21) Appl. No.: 17/980,539

(22) Filed: Nov. 3, 2022

(65) Prior Publication Data

US 2024/0118605 A1 Apr. 11, 2024

(30) Foreign Application Priority Data

Oct. 7, 2022 (TW) .................................. 111138201

(51) Int. Cl.
*G03F 1/36* (2012.01)
(52) U.S. Cl.
CPC ...................................... *G03F 1/36* (2013.01)
(58) Field of Classification Search
None
See application file for complete search history.

(56) References Cited

U.S. PATENT DOCUMENTS

| 8,321,818 | B2 | 11/2012 | Agarwal et al. |
| 11,048,161 | B2 | 6/2021 | Wang et al. |
| 2002/0182550 | A1* | 12/2002 | Hsieh .................... G03F 1/36 430/394 |
| 2003/0051225 | A1* | 3/2003 | Mori ..................... G06F 30/39 430/5 |
| 2007/0231710 | A1* | 10/2007 | Aton ...................... G03F 1/36 430/311 |
| 2019/0163049 | A1* | 5/2019 | Beylkin ................. G03F 1/70 |

FOREIGN PATENT DOCUMENTS

| CN | 108695184 | 10/2018 |
| EP | 1816517 | 8/2007 |
| TW | 201415159 | 4/2014 |

OTHER PUBLICATIONS

"Office Action of Taiwan Counterpart Application", issued on Mar. 14, 2023, p. 1-p. 4.

* cited by examiner

*Primary Examiner* — Anca Eoff
(74) *Attorney, Agent, or Firm* — JCIPRNET

(57) ABSTRACT

A method for forming a photomask includes the following steps. A first target pattern is provided, wherein the first target pattern includes a first pattern area and a second pattern area. The first pattern area includes a block pattern. The second pattern area includes multiple stripe patterns. A first sidewall reset area is defined in the second pattern area. A retarget procedure is executed on the first target pattern to obtain a second target pattern. The photomask is formed based on the second target pattern.

13 Claims, 7 Drawing Sheets

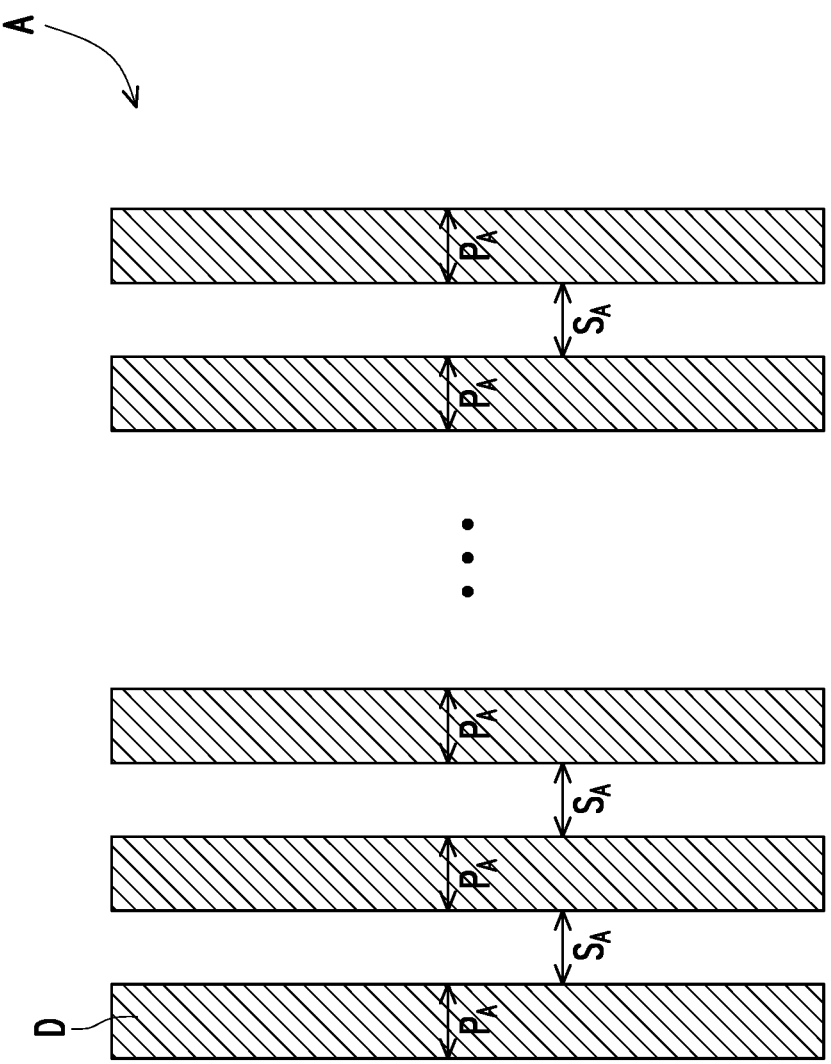

METHOD FOR FORMING PHOTOMASK

CROSS-REFERENCE TO RELATED APPLICATION

This application claims the priority benefit of Taiwan application serial no. 111138201, filed on Oct. 7, 2022. The entirety of the above-mentioned patent application is hereby incorporated by reference herein and made a part of this specification.

BACKGROUND

Technical Field

The disclosure relates to a method for forming a photomask.

Description of Related Art

In recent years, various semiconductor elements are all developing toward the direction of area reduction, and one of the most critical processes that determines the area of the semiconductor element is the photolithography process. The critical dimension (CD) of various structures in the semiconductor element is determined by the photolithography process. Therefore, in order to reduce the area of the semiconductor element, it is necessary to improve the related technology of the photolithography process.

Generally speaking, the target CD of the developed pattern on the photoresist layer is an important factor in determining the resolution of the photolithography process. At present, in order to reduce the target CD of the developed pattern, a light source with a short wavelength may be used for exposure. However, as the target CD shrinks, the requirements for the precision of the photolithography process must increase.

SUMMARY

The disclosure provides a method for forming a photomask, and the formed photomask can improve the precision of a lithography process.

At least one embodiment of the disclosure provides a method for forming a photomask, which includes the following steps. A first target pattern is provided. The first target pattern includes a first pattern area and a second pattern area. The first pattern area includes a block pattern with a width P1. The second pattern area includes multiple stripe patterns. The stripe pattern is arranged along a direction away from the first pattern area. A width of each of the stripe patterns is P2, and P1 is greater than P2. A first sidewall reset area is defined in the second pattern area. A retarget procedure is executed on the first target pattern to obtain a second target pattern. The retarget procedure includes retracting a sidewall of one side of the block pattern facing the adjacent stripe pattern; and expanding sidewalls of at least part of the stripe patterns in the first sidewall reset area toward the adjacent stripe patterns or the adjacent block pattern. The photomask is formed based on the second target pattern.

BRIEF DESCRIPTION OF THE DRAWINGS

FIG. 1 is a schematic top view of a photomask according to an embodiment of the disclosure.

DETAILED DESCRIPTION OF DISCLOSED EMBODIMENTS

FIG. 1 is a schematic top view of a photomask according to an embodiment of the disclosure. Specifically, FIG. 1 is used to illustrate a minimum pattern width $P_A$ and a minimum stripe pattern distance $S_A$ of an exposure process applicable to a photomask A. The minimum pattern width $P_A$ and the minimum stripe pattern distance $S_A$ may be interpreted as the width of a pattern and the distance between patterns on the photomask A when a target photoresist pattern has the maximum resolution.

Please refer to FIG. 1. In some embodiments, in order to obtain the minimum pattern width $P_A$ and the minimum stripe pattern distance $S_A$ of the exposure process applicable to the photomask A, the photomask A including more than 25 continuously arranged stripe structures D is formed, and the stripe structure D has the minimum pattern width $P_A$ and the minimum stripe pattern distance $S_A$. Next, the exposure process and a development process are performed on a photoresist (not shown) using the photomask A, so as to form more than 25 continuously arranged stripe photoresists (not shown). Under the premise that the stripe photoresist has a minimum width and there is a minimum spacing between the stripe photoresists, the width of the stripe pattern D and the distance between the stripe patterns D on the photomask A are respectively the minimum pattern width $P_A$ and the minimum stripe pattern distance $S_A$.

In some embodiments, the minimum pattern width $P_A$ and the minimum stripe pattern distance $S_A$ are obtained using the aforementioned method in an experimental or simulated manner, but the disclosure is not limited thereto. In other embodiments, other manners may also be adopted to calculate the minimum pattern width $P_A$ and the minimum stripe pattern distance $S_A$ of the photomask A.

The minimum pattern width $P_A$ and the minimum stripe pattern distance $S_A$ on the photomask A vary depending on the equipment used for the exposure process of the photomask A. For example, when a light source with a reduced wavelength is used for exposure, the actual values of the minimum pattern width $P_A$ and the minimum stripe pattern distance $S_A$ on the photomask A will decrease accordingly.

Figure 2A:
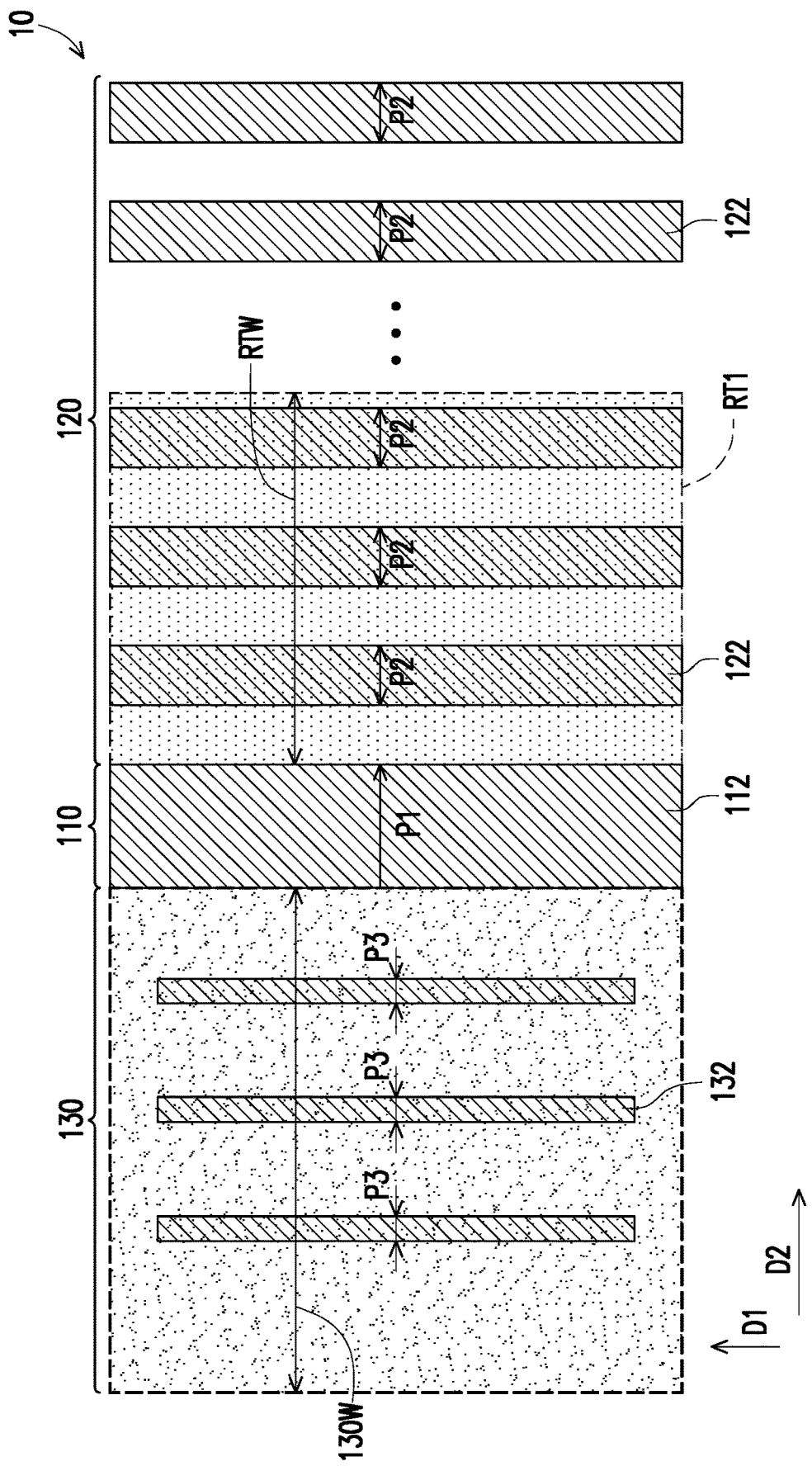
FIG. 2A to FIG. 2C are schematic views of a method for forming a photomask according to an embodiment of the disclosure.
Figure 2B:
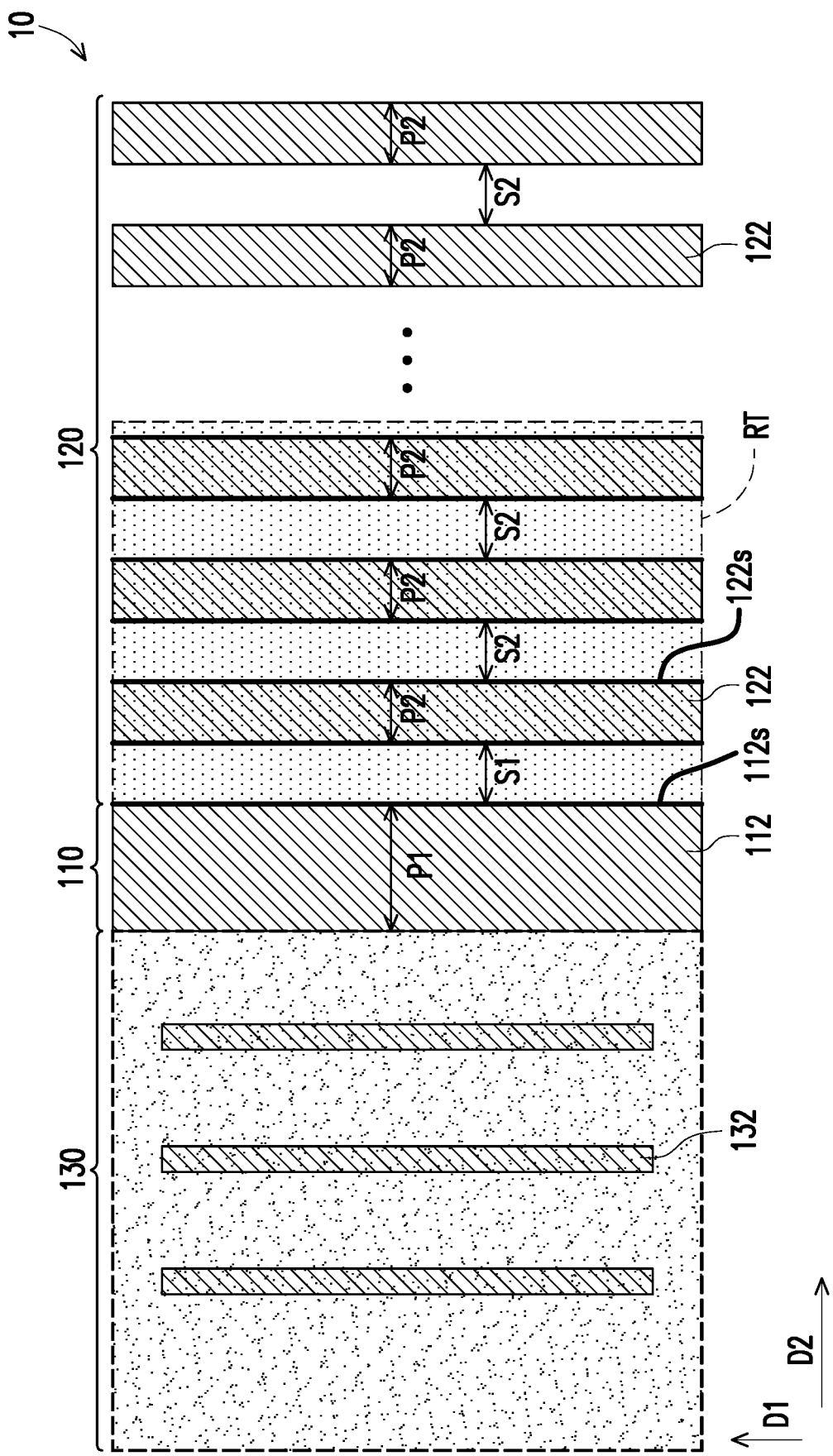
Figure 2C:
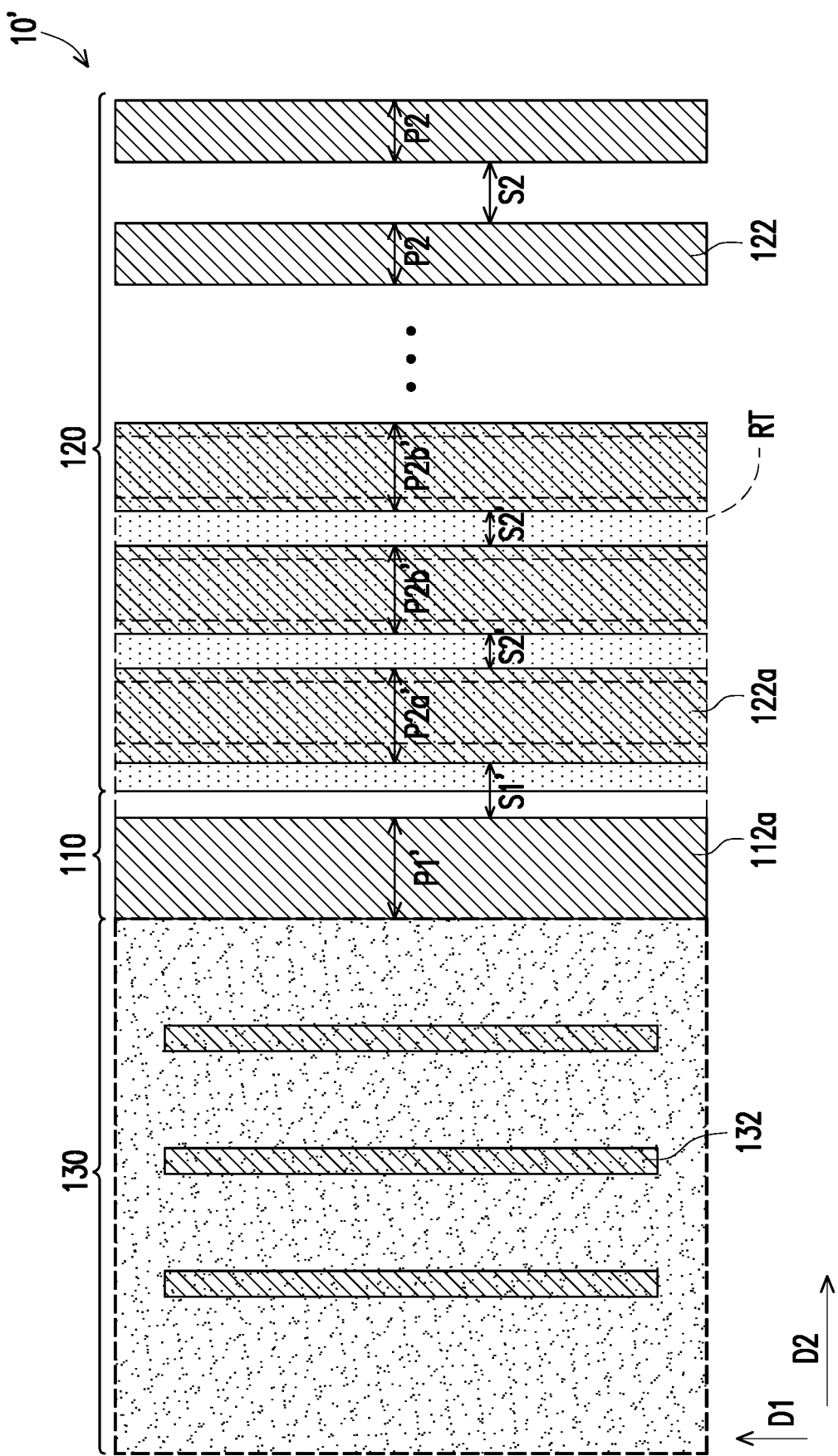

FIG. 2A to FIG. 2C are schematic views of a method for forming a photomask according to an embodiment of the disclosure, wherein the patterns shown in FIG. 2A to FIG. 2C are used to illustrate each step of designing the shape of the photomask in design software, simulation software, or correction software. In other words, the patterns shown in FIG. 2A to FIG. 2C are stored in a memory or other storage media in the form of, for example, data, patterns, or other forms.

Please refer to FIG. 2A. A first target pattern 10 is provided. The first target pattern 10 includes a first pattern area 110 and a second pattern area 120. In some embodiments, the first target pattern 10 optionally further includes a depletion region 130. The first pattern area 110 is located between the second pattern area 120 and the depletion region 130. In other words, the other side of the first pattern area 110 opposite to the second pattern area 120 optionally includes the depletion region 130.

The first pattern area 110 includes a block pattern 112 with a width P1. The second pattern area 120 includes multiple stripe patterns 122, wherein the width of each of the stripe patterns 122 is P2. In the embodiment, P1 is greater than P2. In the embodiment, the block pattern 112 and the stripe pattern 122 are parallel to each other and both extend along a first direction D1. The stripe patterns 122 are arranged along a second direction D2 away from the first pattern area 110.

The minimum pattern width $P_A$ and the minimum stripe pattern distance $S_A$ of the photomask are obtained by the method and the related description of FIG. 1 or other methods. In some embodiments, the width P2 of each of the stripe patterns 122 in the first target pattern 10 is less than 1.09 times $P_A$ and greater than or equal to $P_A$. In some embodiments, the width P1 of the block pattern 112 in the first target pattern 10 is greater than 1.4 times $P_A$.

In some embodiments, the depletion region 130 does not include any structure or the structure in the depletion region 130 is not transferred onto a photoresist pattern after a photolithography process due to the very small size. For example, the depletion region 130 includes a polygonal pattern 132 with a width P3 less than 0.6 times $P_A$. In some embodiments, a width 130W of the depletion region 130 is greater than or equal to $4(P_A+S_A)$.

A first sidewall reset area RT1 is defined in the second pattern area 120. In some embodiments, the first sidewall reset area RT1 is located on one side of the first pattern area 110 and overlaps with several stripe patterns 122 in the second pattern area 120 that are closest to the first pattern area 110. In some embodiments, a width RTW of the first sidewall reset area RT1 is equal to $4(P_A+S_A)$. In the embodiment, a part of the stripe patterns 122 overlaps with the first sidewall reset area RT1, and another part of the stripe patterns 122 does not overlap with the first sidewall reset area RT1, but the disclosure is not limited thereto. In other embodiments, all the stripe patterns 122 overlap with the first sidewall reset area RT1.

Next, please refer to FIG. 2B and FIG. 2C. A retarget procedure is executed on the first target pattern 10 to obtain a second target pattern 10'. In some embodiments, the retarget procedure includes intercepting an effective sidewall of the block pattern 112 and/or the stripe pattern 122, and then moving the effective sidewall of the block pattern 112 and/or the stripe pattern 122. For example, the retarget procedure includes retracting a sidewall 112s of one side of the block pattern 112 facing the adjacent stripe pattern 122, and expanding sidewalls 122s of at least part of the stripe patterns 122 in the first sidewall reset area RT1 toward the adjacent stripe patterns 122 or the adjacent block pattern 112.

For example, please refer to FIG. 2B. An effective sidewall among the sidewalls 122s of the stripe patterns 122 overlapping with the first sidewall reset area RT1 and an effective sidewall among the sidewalls 112s of the block pattern 112 are selected. The length of the effective sidewall in the first direction D1 is greater than 3 times $P_A$, and the distance between the effective sidewall and the adjacent block pattern 112 or the adjacent stripe pattern 122 is less than 1.09 times $S_A$ and greater than 1 times $S_A$. In the embodiment, in the first target pattern 10, a distance S1 between the block pattern 112 and the adjacent stripe pattern 122 and a distance S2 between the two adjacent stripe patterns 122 are both less than 1.09 times $S_A$ and greater than or equal to 1 times $S_A$.

In FIG. 2B, the effective sidewall of the block pattern 112 and/or the stripe pattern 122 is indicated by a thick line. In the embodiment, the sidewalls 122s of each stripe pattern 122 overlapping with the first sidewall reset area RT1 are effective sidewalls, but the disclosure is not limited thereto. In other embodiments, the sidewalls 122s of a part of the stripe patterns 122 overlapping with the first sidewall reset area RT1 are not effective sidewalls.

After determining the effective sidewall among the sidewalls 122s of the stripe pattern 122 and the effective sidewall among the sidewalls 112s of the block pattern 112, the effective sidewall of the block pattern 112 and/or the stripe pattern 122 is moved to obtain the second target pattern 10' including a block pattern 112*a*, a stripe pattern 122*a*, and the stripe pattern 122, as shown in FIG. 2C. In the embodiment, the second target pattern 10' further includes the stripe pattern 122 with the sidewalls not moved and the depletion region 130.

In the embodiment, the effective sidewall of the block pattern 112 is retracted toward a direction away from the stripe pattern 122 and parallel to the second direction D2, so as to form the block pattern 112*a* with a width P1'. For example, the effective sidewall of the block pattern 112 is retracted by 2.5 nm.

In addition, each effective sidewall of the stripe pattern 122 expands along a direction parallel to the second direction D2. For example, the sidewall 122s (the effective sidewall) of the stripe pattern 122 closest to the first pattern area 110 expands by a distance A toward the first pattern area 110, and the sidewalls 122s (the effective sidewalls) of the other stripe patterns 122 in a first sidewall reset area RT expand by a distance B toward the adjacent stripe patterns 122. In some embodiments, since the sidewall of the block pattern 112 facing one side of the stripe pattern 122 is retracted, the sidewall of one side of the stripe pattern 122 closest to the block pattern 112 facing the block pattern 112 has a larger expansion space. Therefore, in some embodiments, A is greater than B. In other words, the distance A of the stripe pattern 122 closest to the block pattern 112 expanding to the left is greater than the distance B of expanding to the right, and the stripe pattern 122*a* is formed after the expansion. The distance B of the other stripe patterns 122 in the first sidewall reset area RT expanding to the left is equal to the distance B of expanding to the right. In some embodiments, A is greater than 14.5% of $P_A$ and B is greater than 9.1% of $P_A$. In the embodiment, a width P2*a*' of the stripe pattern 122*a* closest to the block pattern 112*a* is greater than a width P2*b*' of the other stripe patterns 122*a*.

In some embodiments, after executing the retarget procedure, a distance S1' between the stripe pattern 122*a* and the block pattern 112*a* is the same as or different from the distance S1 (please refer to FIG. 2B) before executing the retarget procedure. In addition, after executing the retarget procedure, a distance S2' between the two adjacent stripe patterns 122*a* is less than the distance S2 (please refer to FIG. 2B) before executing the retarget procedure. Finally, the photomask is formed based on the second target pattern 10'.

Generally speaking, when the photomask is used for the exposure process, if the photomask includes a block pattern and multiple continuous stripe patterns adjacent to the block pattern, the exposure of the stripe pattern is easily affected by the block pattern, wherein the region of the stripe patterns close to the block pattern is most easily affected, which causes a decline in the accuracy of the photolithography process. In the disclosure, the first target pattern 10 (please refer to FIG. 2A) is corrected to the second target pattern 10' by the retarget procedure, so as to improve the issue of the decline in the accuracy of the photolithography process and enable the photoresist pattern obtained by the photolithography process to be closer to the original expected pattern (the first target pattern 10).

Figure 3:
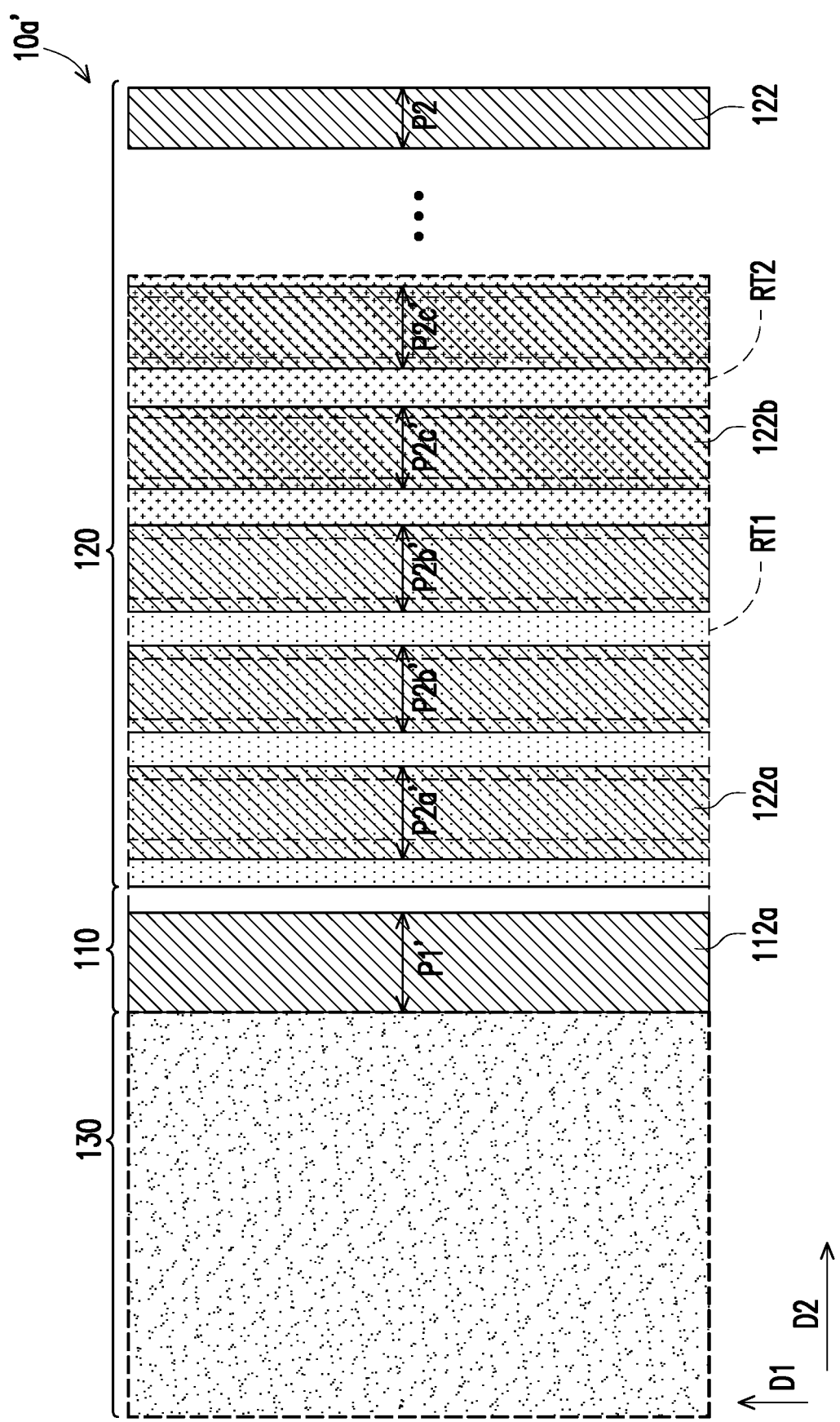
FIG. 3 is a schematic view of a method for forming a photomask according to an embodiment of the disclosure.

FIG. 3 is a schematic view of a method for forming a photomask according to an embodiment of the disclosure. It must be noted here that the embodiment of FIG. 3 continues to use the reference numerals and some content of the embodiment of FIG. 2A and FIG. 2B, wherein the same or similar reference numerals are adopted to represent the same or similar elements, and the description of the same technical content is omitted. For the description of the omitted part, reference may be made to the foregoing embodiment, which will not be repeated here.

In the embodiment of FIG. 3, the first sidewall reset area RT1 and the second sidewall reset area RT2 are defined in the second pattern area 120, wherein the first sidewall reset area RT1 is located between the second sidewall reset area RT2 and the first pattern area 110. In addition, in the embodiment, the depletion region 130 does not include any structure.

In the embodiment, in addition to moving at least part of the sidewalls of the block pattern 112 and/or the stripe patterns 122 in the first sidewall reset area RT1, the retarget procedure also moves at least part of the sidewalls of the stripe patterns 122 in the second sidewall reset area RT2, so as to obtain a second target pattern 10a'.

In the embodiment, the sidewalls 122s of another part of the stripe patterns 122 in the second sidewall reset area RT2 are expanded toward the adjacent stripe patterns 122 to form stripe patterns 122b. In some embodiments, the sidewall of the stripe pattern 122/122b in the second sidewall reset area RT2 is expanded to a lesser extent than the extent to which the sidewall 122s of the stripe pattern 122/122a in the first sidewall reset area RT1 is expanded toward the adjacent stripe pattern 122 or block pattern 112. Finally, the photomask is formed based on the second target pattern 10a'.

Figure 4:
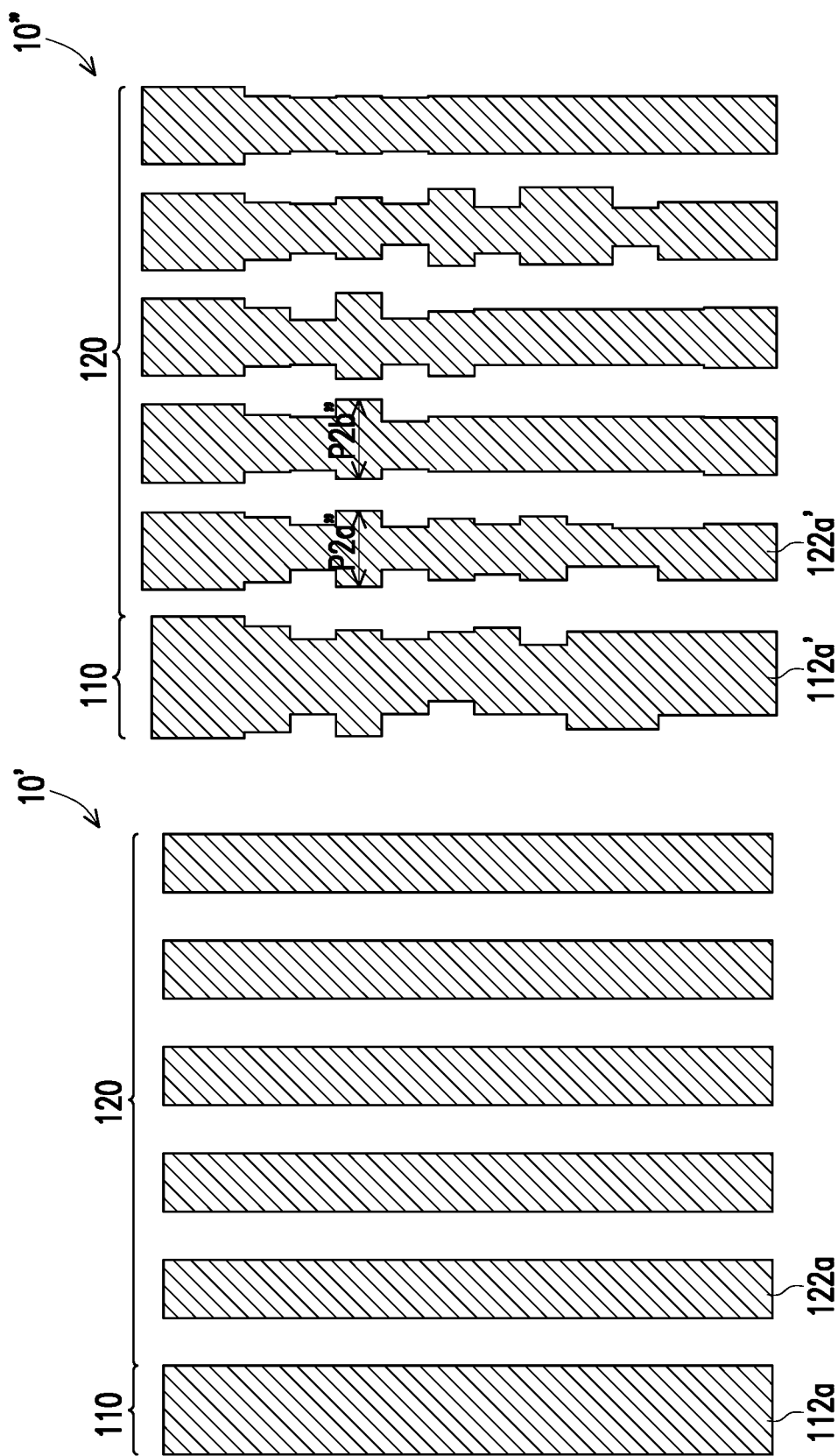
FIG. 4A and FIG. 4B are schematic views of optical proximity correction (OPC) of a photomask according to an embodiment of the disclosure.

FIG. 4A and FIG. 4B are schematic views of optical proximity correction of a photomask according to an embodiment of the disclosure. In the embodiment, forming the photomask based on the second target pattern 10' includes the following steps. First, the second target pattern 10' is corrected based on an optical proximity effect correction model. Next, a corrected second target pattern 10" is transferred onto a photomask material to form the photomask. In some embodiments, for the method for forming the second target pattern 10', reference may be made to the embodiment of FIG. 2A to FIG. 2C. In FIG. 4A, the depletion region 130 in FIG. 2C is omitted.

In the embodiment, if the first target pattern 10 (please refer to FIG. 2A) is directly corrected based on the optical proximity effect correction model, the subsequent exposure to the stripe patterns 122 is easily affected by the block pattern 112, which causes deviations in the photolithography process in the region of the stripe patterns close to the block pattern. In the embodiment, since the retarget procedure is first executed to correct the first target pattern 10 to the second target pattern 10', and the second target pattern 10' is then corrected based on the optical proximity effect correction model, the issue of the deviations in the photolithography process can be improved.

In some embodiments, compared to directly correcting the first target pattern 10 based on the optical proximity effect correction model, the stripe patterns 122a obtained after correcting the second target pattern 10' based on the optical proximity effect correction model have larger widths P2a" and P2b". For example, the width P2a" of the stripe pattern 122a closest to the block pattern 112a is greater than the width of the stripe pattern (not shown) obtained by directly correcting the first target pattern 10 based on the optical proximity effect correction model by more than 5%.

In addition, the width P2b" of the other stripe patterns 122a corrected by the retarget procedure is greater than the width of the stripe pattern (not shown) obtained by directly correcting the first target pattern 10 based on the optical proximity effect correction model by more than 2.2%.

In some embodiments, a ¼ reduction exposure system is used in conjunction with the photomask including the corrected second target pattern 10" to perform the photolithography process, a spacing of a stripe photoresist corresponding to the obtained stripe pattern 122a is X1, and a distance between the two stripe photoresists corresponding to the two stripe patterns 122a is X2. The ¼ reduction exposure system is used in conjunction with the photomask including the first target pattern (not shown) after OPC to perform the photolithography process, a spacing of a stripe photoresist corresponding to the obtained stripe pattern is Y1, and a distance between the two stripe photoresists corresponding to the two stripe patterns is Y2. In some embodiments, X1 is approximately equal to Y1 (the difference between the two is less than 1.5 nm), and X2 is less than Y2 (the difference between the two is greater than or equal to 1.5 nm).

Figure 5:
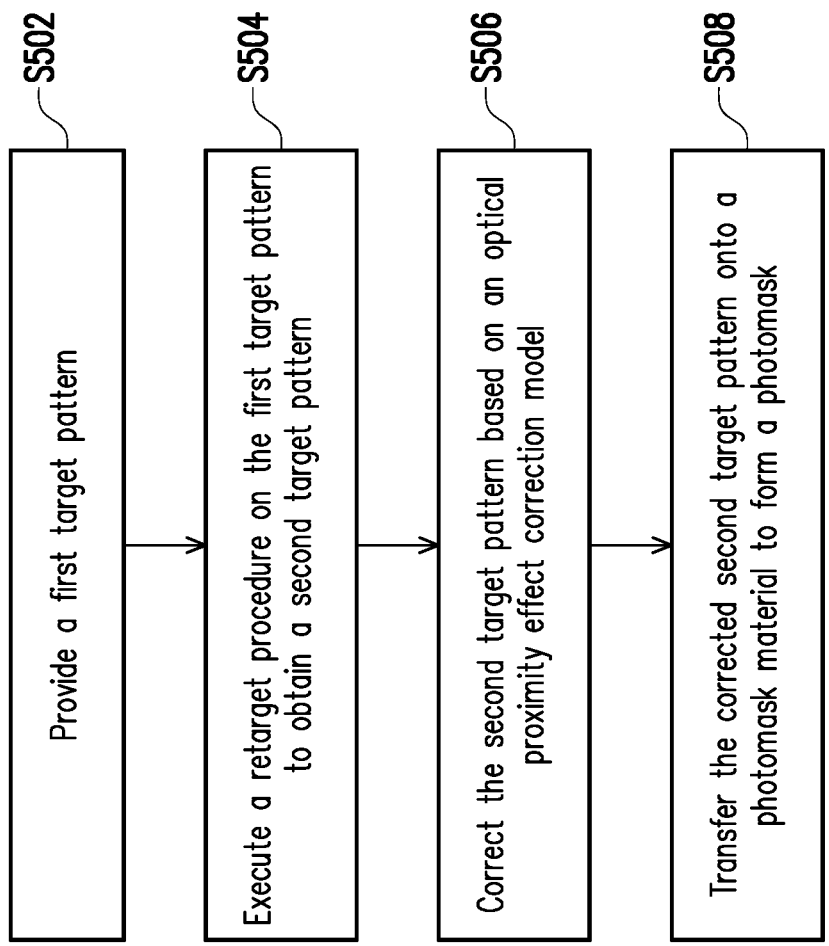
FIG. 5 is a flowchart of a method for forming a photomask according to an embodiment of the disclosure.

FIG. 5 is a flowchart of a method for forming a photomask according to an embodiment of the disclosure. The method for forming the photomask includes the following steps. In Step S502, a first target pattern is provided, as shown in FIG. 2A. In Step S504, a retarget procedure is executed on the first target pattern to obtain a second target pattern, as shown in FIG. 2B and FIG. 2C. In Step S506, the second target pattern is corrected based on an optical proximity effect correction model, as shown in FIG. 4A and FIG. 4B. Finally, in Step S508, the corrected second target pattern is transferred onto a photomask material to form the photomask.

In summary, the method for forming the photomask of the disclosure can improve the process margin of the photolithography process and can improve the issue that the pattern formed by the photolithography process is not precise enough.

What is claimed is:

1. A method for forming a photomask, comprising:
    providing a first target pattern, wherein the first target pattern comprises:
        a first pattern area, comprising a block pattern with a width P1; and
        a second pattern area, comprising a plurality of stripe patterns, wherein the stripe patterns are arranged along a direction away from the first pattern area, a width of each of the stripe patterns is P2, and P1 is greater than P2;
    defining a first sidewall reset area in the second pattern area;
    executing a retarget procedure on the first target pattern to obtain a second target pattern, wherein the retarget procedure comprises:
        retracting a sidewall of the block pattern facing one side of the adjacent stripe pattern; and
        expanding sidewalls of at least part of the stripe patterns in the first sidewall reset area toward the adjacent stripe patterns or the adjacent block pattern; and
    forming the photomask based on the second target pattern.

2. The method for forming the photomask according to claim 1, wherein forming the photomask based on the second target pattern comprises:
  correcting the second target pattern based on an optical proximity effect correction model; and
  transferring the corrected second target pattern onto a photomask material to form the photomask.

3. The method for forming the photomask according to claim 1, wherein a part of the stripe patterns overlaps with the first sidewall reset area, and another part of the stripe patterns does not overlap with the first sidewall reset area.

4. The method for forming the photomask according to claim 1, further comprising:
  setting a minimum pattern width $P_A$ and a minimum stripe pattern distance $S_A$ of an exposure process applicable to the photomask.

5. The method for forming the photomask according to claim 4, wherein $P_A$ and $S_A$ are defined as:
  a limit width of the stripe pattern and a limit distance between the stripe patterns on the photomask when forming more than 25 continuously arranged stripe photoresists by the exposure process on the premise that the stripe photoresist has a minimum width and there is a minimum spacing between the stripe photoresists.

6. The method for forming the photomask according to claim 4, wherein in the first target pattern, the width P2 of each of the stripe patterns is less than 1.09 times $P_A$ and greater than or equal to $P_A$.

7. The method for forming the photomask according to claim 4, wherein in the first target pattern, another side of the first pattern area opposite to the second pattern area comprises a depletion region, wherein a width of the depletion region is greater than or equal to $4(P_A+S_A)$, wherein the depletion region does not comprise any structure or the depletion region comprises a polygonal pattern with a width P3 less than 0.6 times $P_A$.

8. The method for forming the photomask according to claim 4, wherein a width of the first sidewall reset area is equal to $4(P_A+S_A)$.

9. The method for forming the photomask according to claim 4, wherein the retarget procedure further comprises:
  selecting an effective sidewall among sidewalls of the stripe pattern overlapping with the first sidewall reset area, wherein a length of the effective sidewall is greater than 3 times $P_A$, and a distance between the effective sidewall and the adjacent block pattern or the adjacent stripe pattern is less than 1.09 times $S_A$ and greater than or equal to $S_A$; and
  expanding the effective sidewall of the stripe pattern toward the adjacent stripe pattern or the block pattern.

10. The method for forming the photomask according to claim 4, wherein in the retarget procedure, the effective sidewall of the stripe pattern closest to the first pattern area expands by a distance A toward the first pattern area, and the effective sidewalls of the other stripe patterns in the first sidewall reset area expand by a distance B toward the adjacent stripe patterns, wherein A is greater than B.

11. The method for forming the photomask according to claim 10, further comprising:
  setting a minimum pattern width $P_A$ and a minimum stripe pattern distance $S_A$ of an exposure process applicable to the photomask, wherein A is greater than 14.5% of $P_A$ and B is greater than 9.1% of $P_A$.

12. The method for forming the photomask according to claim 1, wherein a distance between the stripe patterns in the first sidewall reset area is reduced after the retarget procedure.

13. The method for forming the photomask according to claim 1, further comprising:
  defining a second sidewall reset area in the second pattern area, wherein the first sidewall reset area is located between the second sidewall reset area and the first pattern area, wherein the retarget procedure further comprises:
    expanding sidewalls of another part of the stripe patterns in the second sidewall reset area toward the adjacent stripe patterns, wherein an extent of expansion is less than an extent to which the sidewalls of at least part of the stripe patterns in the first sidewall reset area are expanded toward the adjacent stripe patterns or the block pattern.

* * * * *